US006760571B2

(12) United States Patent
Prockup

(10) Patent No.: US 6,760,571 B2
(45) Date of Patent: Jul. 6, 2004

(54) AUTOMATIC FREQUENCY DEVIATION DETECTION AND CORRECTION APPARATUS

(75) Inventor: Kenneth M. Prockup, Emmaus, PA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 392 days.

(21) Appl. No.: 10/028,968

(22) Filed: Dec. 18, 2001

(65) Prior Publication Data

US 2003/0114123 A1 Jun. 19, 2003

(51) Int. Cl.[7] ................................................ H04B 1/04
(52) U.S. Cl. ........................ 455/113; 455/112; 455/205; 455/42
(58) Field of Search ............................ 455/42, 44, 110, 455/112, 113, 205

(56) References Cited

U.S. PATENT DOCUMENTS 5,542,113 A  *  7/1996  Fink et al. ................... 455/119
5,740,523 A  *  4/1998  Nakajima et al. ......... 455/186.1
6,035,182 A  *  3/2000  Shurboff ..................... 455/216
6,633,340 B1 * 10/2003  Ohara et al. ................ 348/536

* cited by examiner

Primary Examiner—Nguyen T. Vo
Assistant Examiner—Nhan T. Le
(74) Attorney, Agent, or Firm—Ron Billi

(57) ABSTRACT

An RF carrier signal is frequency modulated by a modulating signal, as a function of the amplitude of the modulating signal. The number of cycles in the frequency modulated carrier is counted in a first counter during the positive half cycle of the modulating signal and in a second counter during the negative half cycle of the modulating signal. A microprocessor obtains the difference of the counts in the counters, and from the difference computes the deviation of the modulated carrier from the center frequency of the carrier. This is compared with a desired deviation and the microprocessor calculates and generates a correction signal to vary the amplitude of the modulating signal when the difference between the computed and desired deviation exceeds a predetermined value. An arrangement is also provided whereby, after a calibration procedure, an external source may provide the modulation signal.

13 Claims, 6 Drawing Sheets

AUTOMATIC FREQUENCY DEVIATION DETECTION AND CORRECTION APPARATUS

STATEMENT OF GOVERNMENT INTEREST

The invention described herein may be manufactured and used by or for the Government of the United States of America for government purposes without the payment of any royalties therefor.

BACKGROUND OF THE INVENTION

In radio transmission, modulation is the process of varying a relatively high frequency carrier waveform with a modulating waveform, representing information or tonal signals. A popular form of modulation is FM (frequency modulation) wherein the frequency of an RF (radio frequency) carrier wave is varied in accordance with the amplitude of a modulating signal. That is, the frequency of the carrier, as a result of the modulation, increases and decreases about a center frequency (the carrier frequency) while its amplitude remains constant.

Different frequency bands are allocated for various uses and users, such as commercial, military and amateur radio entities. In order to ensure that a particular frequency band does not interfere with an adjacent band, the maximum amount of departure from the center frequency of the carrier is strictly regulated. This departure is called the deviation, and the maximum allowable deviation must not be exceeded.

FM apparatus such as receivers, transceivers, cell phones, mobile radio phones and radio communication equipment in general, must be tested and calibrated to ensure proper operation, as well as compliance with regulations regarding maximum deviation. This is typically accomplished with a variety of test and calibration instruments. For many applications, the size and weight of the test instruments far exceed available space, particularly in airborne environments. Additionally, for accurate test results, use is made of a spectrum analyzer. Such spectrum analyzers can be prohibitively expensive and require highly trained operators for proper use. The present invention provides for a relatively low cost and highly accurate FM test instrument which can calibrate, or even be incorporated into, for example, RF radio communication apparatus, as well as various RF signal generators, modulation analyzers and other test equipment.

The present invention can be incorporated within the Acoustic Sensor Signal Generator (ASSG) aboard the U.S. Navy's P-3 aircraft to provide a deviation calibrated ASSG. With the present invention the ASSG will be able to provide calibration tones to the sonobuoy receiver and tape recorder before each data collection mission.

Current modulation analyzers are not capable of measuring deviation below a modulation frequency of 10 Hz, yet current data collection systems operate down to 1 Hz. By utilizing the present invention, modulation can be accurately generated and measured well below a modulation frequency of 1 Hz.

SUMMARY OF THE INVENTION

Automatic frequency deviation correction apparatus in accordance with the present invention includes a source of RF carrier signal of center frequency $F_c$ and a source of modulating signal of frequency $F_m$, having positive and negative half cycles and coupled to modulate the frequency of said carrier signal about said center frequency, as a function of the amplitude of said modulating signal, to produce a frequency modulated output signal.

A feedback arrangement is provided which connects said frequency modulated output signal to a gate circuit as a feedback signal. A gate select means for sensing said positive and negative half cycles of said modulating signal is provided and is operable to cause said gate circuit to provide said feedback signal to a first counter, which counts the number of cycles in said feedback signal during said positive half cycle of said modulating signal. The gate select means is additionally operable to cause said gate circuit to provide said feedback signal to a second counter, which counts the number of cycles in said feedback signal during said negative half cycle of said modulating signal, said number of cycles providing an indication of the deviation of said frequency modulated output signal from said center frequency.

A microprocessor connected to said first and second counters is operable to obtain the count difference between said first and second counters, and from said count difference, determine the deviation of said frequency modulated output signal from said center frequency. The microprocessor may be further operable to calculate and generate a correction signal if the difference between a predetermined desired deviation and said deviation determined by said microprocessor is greater than a predetermined value. The microprocessor applies said correction signal to vary the amplitude of said modulating signal until said difference does not exceed said predetermined value.

In one embodiment, an external source may be selected to provide the modulating signal, after the microprocessor has made any necessary corrections to the amplitude of the modulating signal of frequency $F_m$.

BRIEF DESCRIPTION OF THE DRAWINGS

The invention will be better understood, and further features and advantages thereof will become more apparent from the following description of the preferred embodiment, taken in conjunction with the accompanying drawings, in which.

DETAILED DESCRIPTION OF THE PREFERRED EMBODIMENTS

Figure 1:
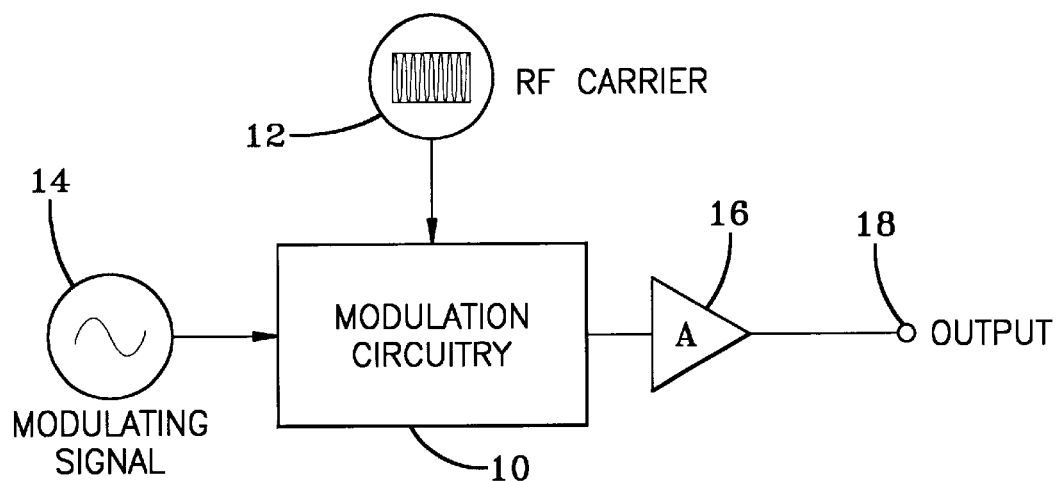
FIG. 1 is a simplified block diagram of a frequency modulation system.

In the drawings, which are not necessarily to scale, like or corresponding parts are denoted by like or corresponding reference numerals.

In FIG. 1, FM modulation circuitry 10 receives an RF carrier signal from RF source 12 as well as a modulating signal from modulation source 14. The modulating waveform from modulating source 14 is shown for simplicity as a sine wave, the amplitude of which varies the frequency of the carrier signal. The carrier deviates from its nominal, or center frequency, by an amount proportional to the instantaneous value of the amplitude of the modulating signal. The resulting FM signal may be amplified in an amplifier 16, provided to output 18 and used for test purposes or may be transmitted to a remote location, by way of example.

Figure 2:
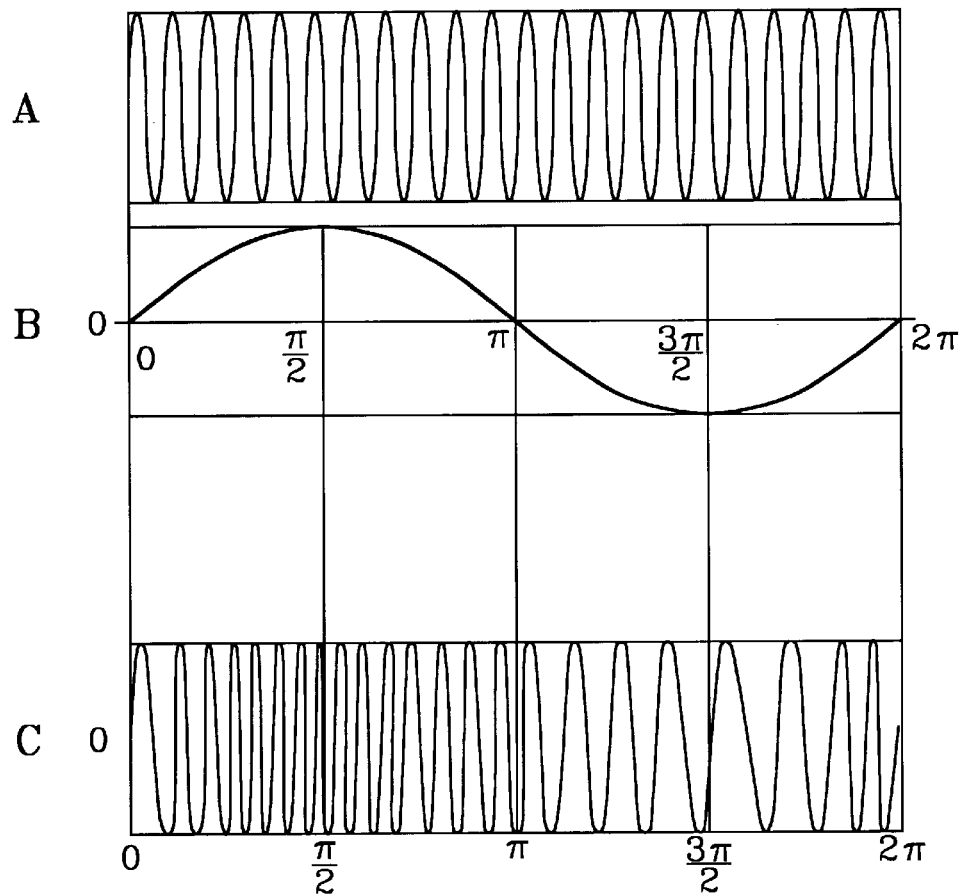
FIG. 2 are waveforms associated with the system of FIG. 1.

FIG. 2 illustrates the waveforms associated with the arrangement of FIG. 1. Waveform A is the continuous, constant amplitude, high frequency RF carrier, and waveform B is the lower frequency modulating wave, shown as a sine wave, although the modulation of the carrier could be by any waveform. One cycle of the modulating waveform is illustrated, from 0 to $2\pi$ radians, corresponding to 0° to 360°. A maximum positive amplitude occurs at $\pi/2$ and a maximum negative amplitude at $3\pi/2$, with zero values at 0, $\pi$ and $2\pi$.

Waveform C illustrates the result of the modulation process. The maximum amplitude of waveform B is at $\pi/2$ and therefore the higher frequencies of the modulated wave are around $\pi/2$, and the lower frequencies are around $3\pi/2$, where waveform B is at a negative maximum. The maximum, or peak, frequency deviation of these higher and lower frequencies must not exceed a certain value, depending upon the desired application of the FM apparatus.

Figure 3:
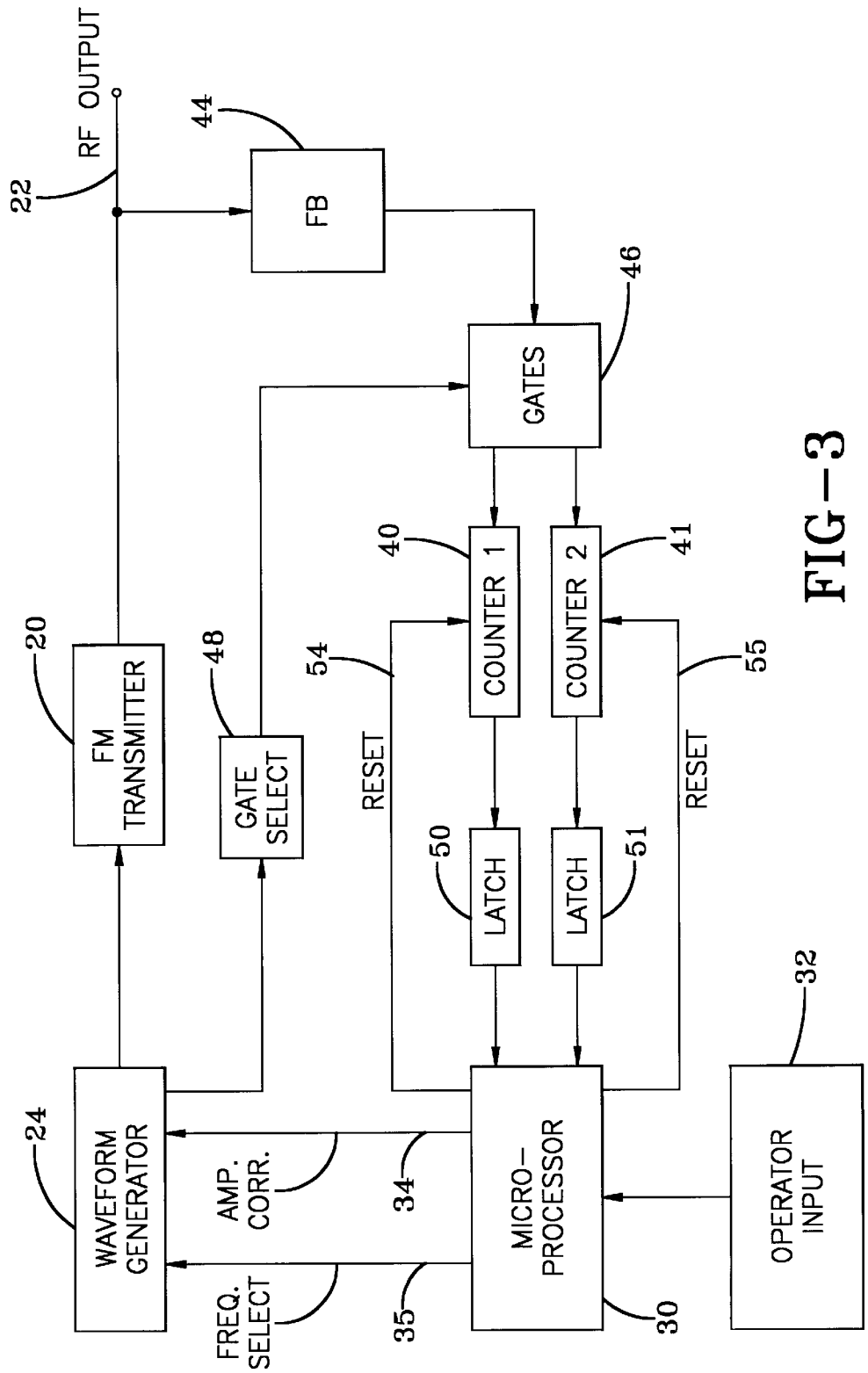
FIG. 3 is a block diagram of one embodiment of the present invention.

FIG. 3 illustrates an embodiment of the present invention which allows the amplitude of a modulation source to be accurately corrected in order to maintain a specified frequency deviation of the modulated wave. FM transmitter 20, corresponding to components 10, 12 and 16 of FIG. 1, provides, at output 22, an RF signal, frequency modulated by the output of a modulation source such as waveform generator 24 operable to produce a periodic desired waveform having positive and negative portions. The operation of the waveform generator 24 is governed by a central control in the form of a microprocessor 30, having an operator input 32 for inputting various parameters including desired operating frequency of the waveform generator 24 and desired frequency deviation.

The microprocessor 30 is in a feedback loop wherein the RF output is continuously examined for each half cycle of the modulating waveform, and in response to this examination, the microprocessor 30 is operable to adjust the amplitude of the modulating waveform from generator 24, if the actual frequency deviation differs from the desired frequency deviation by a predetermined amount. This amplitude correction is accomplished by an amplitude control signal on line 34, and the frequency selection of waveform generator 24 is accomplished by a frequency select signal on line 35.

A first counter 40 is operable to count the number of cycles in the output RF signal at output 22 during a first half cycle, for example, the positive half cycle of the modulating signal from waveform generator 24. In a similar manner, a second counter 41 is operable to count the number of cycles in the output RF signal at output 22 during the second, or negative half cycle of the modulating signal from waveform generator 24. As will be described, the microprocessor 30 examines the contents of the two counters 40 and 41 and derives an amplitude correction signal on line 34, if needed.

A feedback arrangement 44 connects the RF frequency modulated output signal at output 22 as a feedback signal to a gate circuit 46. The gate circuit 46 is operable to direct the feedback signal to the proper counter 40 or 41, as a function of the positive or negative half cycle of the modulating waveform. This is accomplished with the provision of a gate select function 48 which monitors the modulating signal for positive and negative values.

After one or more counting cycles, the counters 40 and 41 provide their count to respective latches 50 and 51, and are thereafter reset by the microprocessor 30 by means of reset signals on respective reset lines 54 and 55. The counting process is continued and the microprocessor 30 continuously examines the latch values to compute any necessary correction factor to be applied to the amplitude of the modulating wave from waveform generator 24, should the frequency deviation differ by a predetermined amount from the desired frequency deviation, input by the operator.

Figure 4:
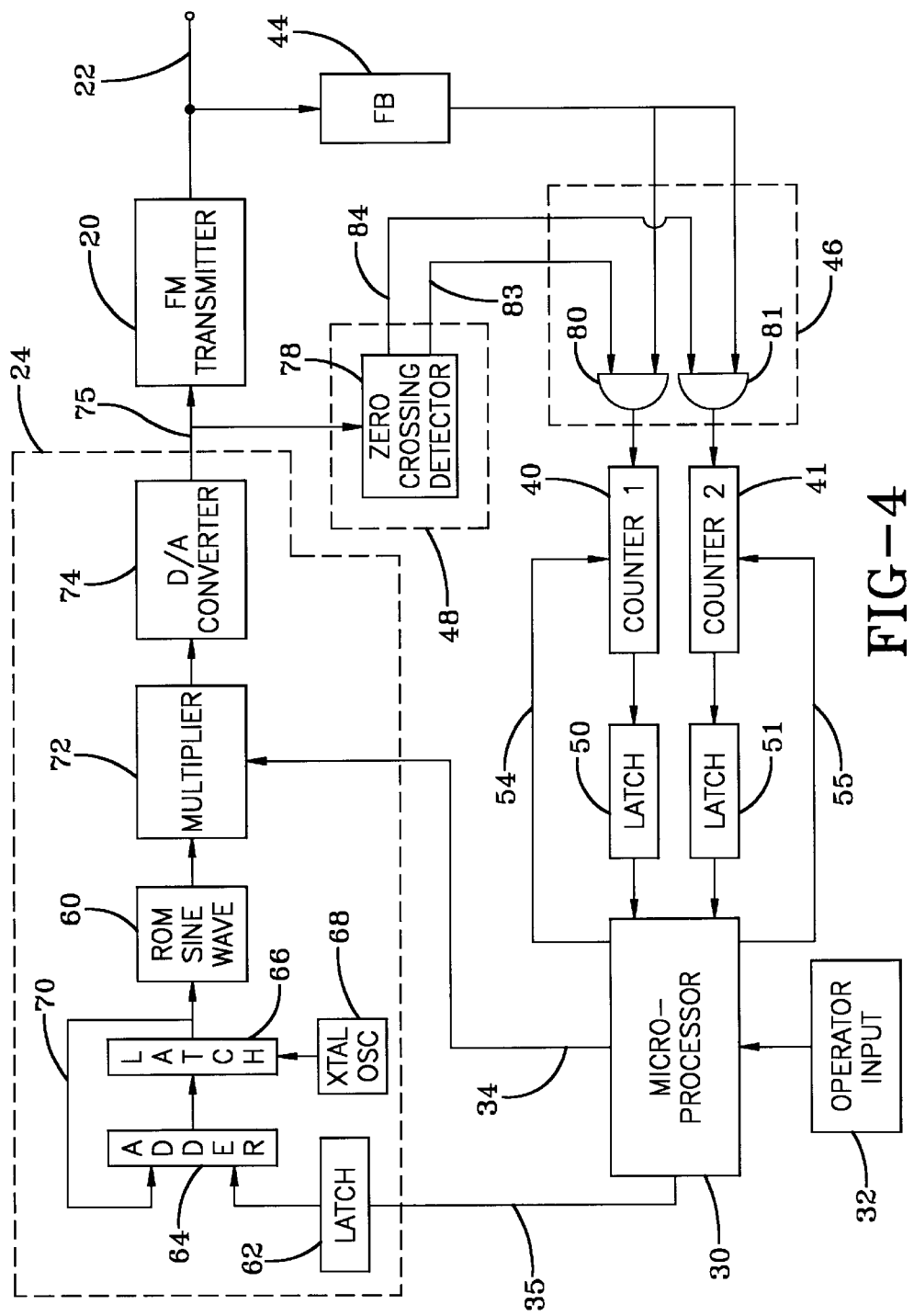
FIG. 4 duplicates the arrangement of FIG. 3 and illustrates one type of waveform generator in more detail.

FIG. 4 duplicates FIG. 3 and illustrates some of the components in more detail for an embodiment of the invention which utilizes a sine wave as the modulating waveform. The waveform generator 24, in FIG. 4, is a direct digital synthesizer which includes a ROM (read only memory) 60 having addressable storage locations.

The digital circuitry also includes a first latch 62 providing an output to adder 64 which is connected to a second latch 66. This second latch is provided with a clocking signal from crystal oscillator 68. The arrangement is such that on each clock pulse from oscillator 68, adder 64 adds the initial value from latch 62, with the current value from latch 66, via feedback line 70, while the current value in latch 66 addresses a corresponding storage location in ROM 60. The value at this storage location is multiplied, in multiplier 72, by an amplitude value on line 34 from microprocessor 30, with the result being converted into an analog form by D/A (digital-to-analog) converter 74 for presentation to FM transmitter 20 via line 75.

The gate select function 48 may be constituted by a variety of devices such as the zero crossing detector 78 illustrated. Other means for accomplishing this function include comparator circuitry (with a zero voltage reference) or placing a sign-changing bit in the ROM 60, by way of example.

The gate circuit 46 may be comprised of first and second AND gates 80 and 81, each receiving #respective enabling signal from zero crossing detector 78, first on line 83 when the output of waveform generator 24 is positive, and then on line 84 when the output of waveform generator 24 is negative. When AND gate 80 is enabled, the FM signal at output 22 is passed through to counter 40 which counts up the number of cycles of output signal during the positive phase of the modulating waveform from waveform generator 24. Similarly, When AND gate 81 is enabled, the FM signal at output 22 is passed through to counter 41 which counts up the number of cycles of output signal during the negative phase of the modulating waveform. This operation is illustrated in FIG. 5, to which additional reference is made.

Figure 5:
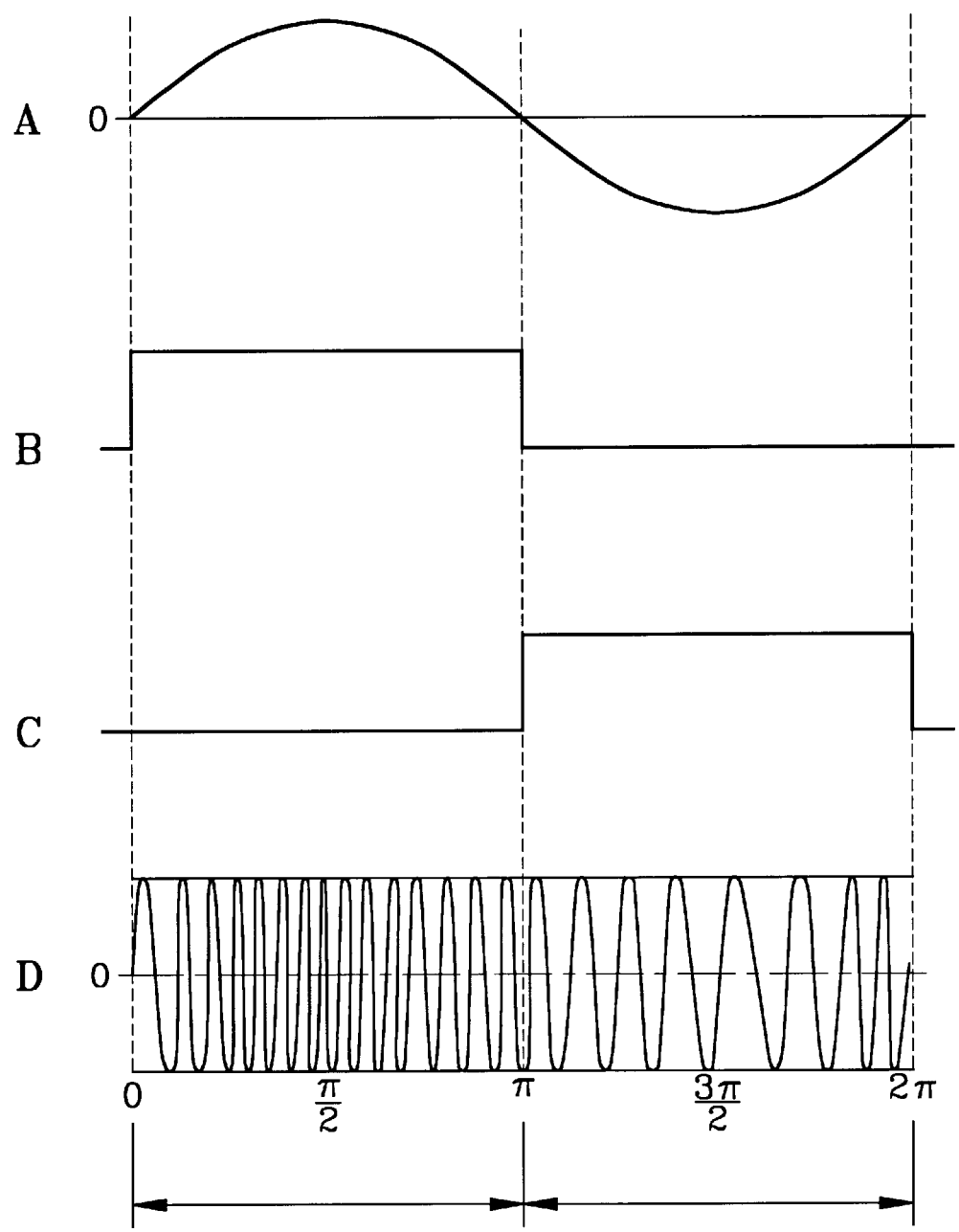
FIG. 5 are waveforms to illustrate the operation of the apparatus of FIG. 4.

In FIG. 5, waveform A represents the modulating sine wave signal produced by waveform generator 24. The signal increases from a zero value at 0, to a positive maximum at $\pi/2$, goes through zero at $\pi$, reaches a negative maximum at $3\pi/2$ and returns to zero at $2\pi$, completing one full cycle. During the positive half of this cycle, the zero crossing detector 78 provides the gate signal of waveform B to AND gate 80 allowing the first half of the output signal, waveform D, from 0 to $\pi$, to be gated through to counter 40. During the negative half of waveform A, the zero crossing detector 78 provides the gate signal of waveform C to AND gate 81 allowing the second half of the output signal, waveform D, from $\pi$ to $2\pi$, to be gated through to counter 41.

The higher the count in the counters 40 and 41, the more accurate will be the computation of amplitude correction, by microprocessor 30. Accordingly, depending on the modulating frequency, the count in the counters 40 and 41 may be allowed to accumulate over many cycles of waveform A, whereupon the counts are transferred to respective latches 50 and 51 for computational purposes, to be described. The counters are then reset by reset signals on respective lines 54 and 55, and the process repeats.

Figure 6:
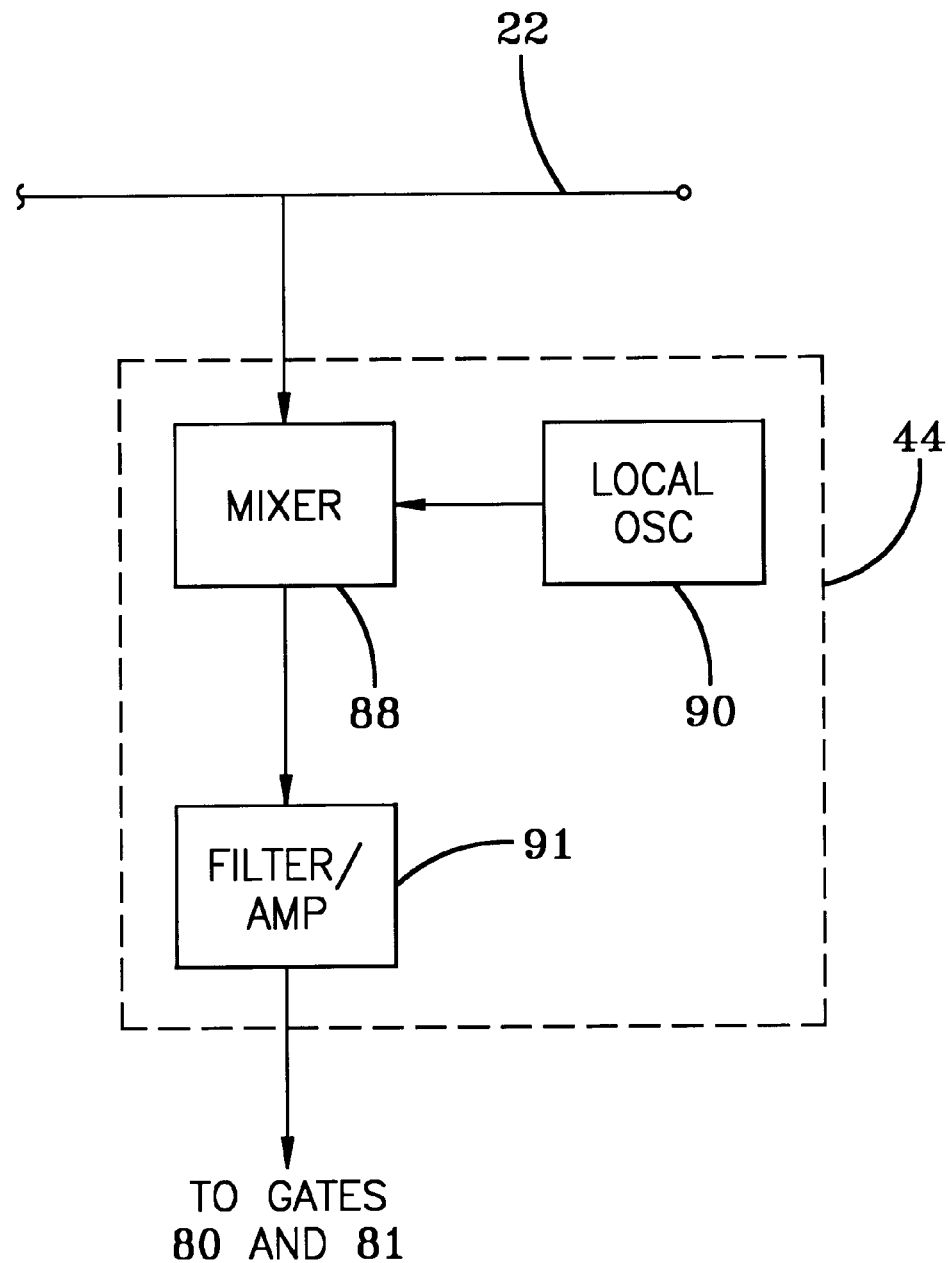
FIG. 6 is a simplified block diagram of a system for generating an intermediate frequency.

The output FM signal provided to gates 80 and 81 is provided via feedback arrangement 44 as a feedback signal. In its simplistic form the feedback arrangement could be a direct wire connection. Other forms of feedback include limiter or comparison circuits for producing a squarer waveform for presentation to the gates. In addition, depending on the capabilities of the counters, it may be necessary to reduce the frequency of the output signal. This may be accomplished, as illustrated in FIG. 6, by providing the output signal to a mixer 88 and mixing it with a signal from a local oscillator 90, to produce an IF (intermediate frequency) output equal to the difference between the locally generated signal from oscillator 90 and the carrier frequency, but containing all of the original modulation. The operation produces sum and difference frequencies and accordingly, a filter/amplifier circuit 91 is provided to ensure that only the lower, difference frequencies are passed. This IF signal is then provided as the feedback signal to the gates 80 and 81.

Referring once again to FIG. 4, in response to the operator input of the desired modulating frequency, the microprocessor 30, computes a value, L, to be initially entered into the first latch 62, in accordance with the following:

$$L = \frac{F_m \cdot 2^n}{F_{xtal}} \qquad \text{Eq. (1)}$$

where
 $F_m$ is the desired modulation frequency
 n is the number of bits within the adder 64
 $F_{xtal}$ is the frequency of crystal oscillator 68

With a crystal oscillator frequency of $F_{xtal}$, the oscillator produces a clock pulse every $1/F_{xtal}$ sec. If the initial number in the second latch 66 is zero, then the result of addition in adder 64, on the first clock pulse, is the number L placed into latch 66. Thereafter the number L is added to the output of latch 66 (via line 70) on every subsequent clock pulse. Latch 66 provides this number to ROM 60 and is indicative of a ROM address containing a sine value. The data recorded in the ROM is based upon the following formula:

$$Y_i = \sin\left(\frac{2\pi \cdot i}{2^m}\right) \qquad \text{Eq. (2)}$$

where
 i is the address in ROM 60
 m is the number of bits in the ROM address
 $Y_i$ is the output value provided by ROM 60

On the next clock pulse, L is added to L, resulting in 2L, representing the next address for the ROM 60 to be read out. On the next clock pulse, 2L is added to L, resulting in 3L, representing the next address for the ROM to be read out. The process is continued until the entire sine wave is read out, and is then repeated in its entirety such that ROM 60 delivers a continuous sine wave representation (still in digital form) to multiplier 72.

Multiplier 72 is operable to generate an output sine wave representation (still in digital form) in accordance with the formula:

$$Z = A \cdot Y \qquad \text{Eq. (3)}$$

where
 A is the amplitude coefficient supplied by microprocessor 30
 Y is the data value from ROM 60
 Z is the resultant output of the multiplier 72 and is supplied to D/A converter 74 which provides, on line 75, an analog sine wave, which is the first waveform (A) as illustrated in FIG. 5.

The amplitude correction is accomplished by microprocessor 30 as a function of the count values in first and second counters 40 and 41. More particularly, counter 40 counts the number of cycles of RF output signal, occurring during the positive half cycle of the modulating waveform. In a like fashion, counter 41 counts the number of cycles of RF output signal, occurring during the negative half cycle of the modulating waveform. The resulting count in each counter therefore, is indicative of the deviation DP occurring due to the positive and negative modulation. This may be expressed, for the first counter 40, as:

$$counter_1 = \frac{\int_0^\pi F_c + D_p \cdot \sin(t) dt}{F_m \cdot 2\pi} \qquad \text{Eq. (4)}$$

and for the second counter 41, as:

$$counter_2 = \frac{\int_\pi^{2\pi} F_c + D_p \cdot \sin(t) dt}{F_m \cdot 2\pi} \qquad \text{Eq. (5)}$$

where
 $F_c$ is the carrier frequency
 $F_m$ is the modulation frequency
 $D_p$ is an indication of the deviation The difference in the count, $\text{DELTA}_{count}$, of the two counters creates a number proportional to deviation in accordance with:

$$\Delta count = \frac{\int_0^\pi F_c + D_p \cdot \sin(t) dt - \int_\pi^{2\pi} F_c + D_p \cdot \sin(t) dt}{F_m \cdot 2\pi} \qquad \text{Eq. (6)}$$

and the measurement of the actual deviation $D_m$ is obtained by:

$$D_m = \frac{(counter_1 - counter_2) \cdot \pi \cdot F_m}{\int_0^\pi \sin(t) dt} \qquad \text{Eq. (7)}$$

As previously indicated, for greater accuracy, the first and second counters 40 and 41 may accumulate their counts over a number, N, of modulating cycles before they are reset by microprocessor 30. If such is the case, then Eq. (7) becomes:

$$D_m = \frac{(counter_1 - counter_2) \cdot \pi \cdot F_m}{N \cdot \int_0^\pi \sin(t) dt} \qquad \text{Eq. (8)}$$

In operation, microprocessor 30 may initially set the amplitude coefficient A to some predetermined value such as a mid value, that is, to half of full scale. The microprocessor 30 then computes a deviation value in accordance with Eq. (7), [or (8)]. The measured deviation value $D_m$, obtained as a result of the computation, is compared to a desired deviation, $D_o$, input by the operator, and if these compared values differ by more than a preset amount, for example, if they differ by more than 0.01 dB, the amplitude coefficient A is set to:

$$A = \frac{A \cdot D_o}{D_m} \quad \text{Eq. (9)}$$

and the computation and correction are repeated until the $D_o$ and $D_m$ difference is within the 0.01 dB preset amount. It is to be noted that prior to these calculations, counters 40 and 41 may be initialized to compensate for any differences that may exist in propagation times of AND gates 80 and 81, as well as the difference (if any) in the widths of the gate enabling signals (waveforms B and C of FIG. 5).

The above procedure may be repeated at various modulation frequencies stepped in linear or logarithmic spacing programmed in microprocessor 30 so that the frequency response of an FM receiver on the demodulated output may be measured.

The arrangement of FIG. 4 essentially averages the deviation indication over a full half cycle of modulating waveform. This ensures that any noise that may be present does not correlate and erroneously contribute to the measured value. That is, the deviation is measured by integrating the output waveform over that half cycle of the modulating signal.

The foregoing example described operation with respect to a sine wave modulation of an RF carrier. The apparatus, in general, is applicable to any symmetrical modulating waveform. If the modulating waveform is generically defined by f(t), then Eq. (2) becomes:

$$Y_i = f\left(\frac{2\pi \cdot i}{2^m}\right) \quad \text{Eq. (10)}$$

and Eq.(7) becomes:

$$D_m = \frac{(counter_1 - counter_2) \cdot \pi \cdot F_m}{\int_0^\pi f(t)dt} \quad \text{Eq. (11)}$$

Figure 7:
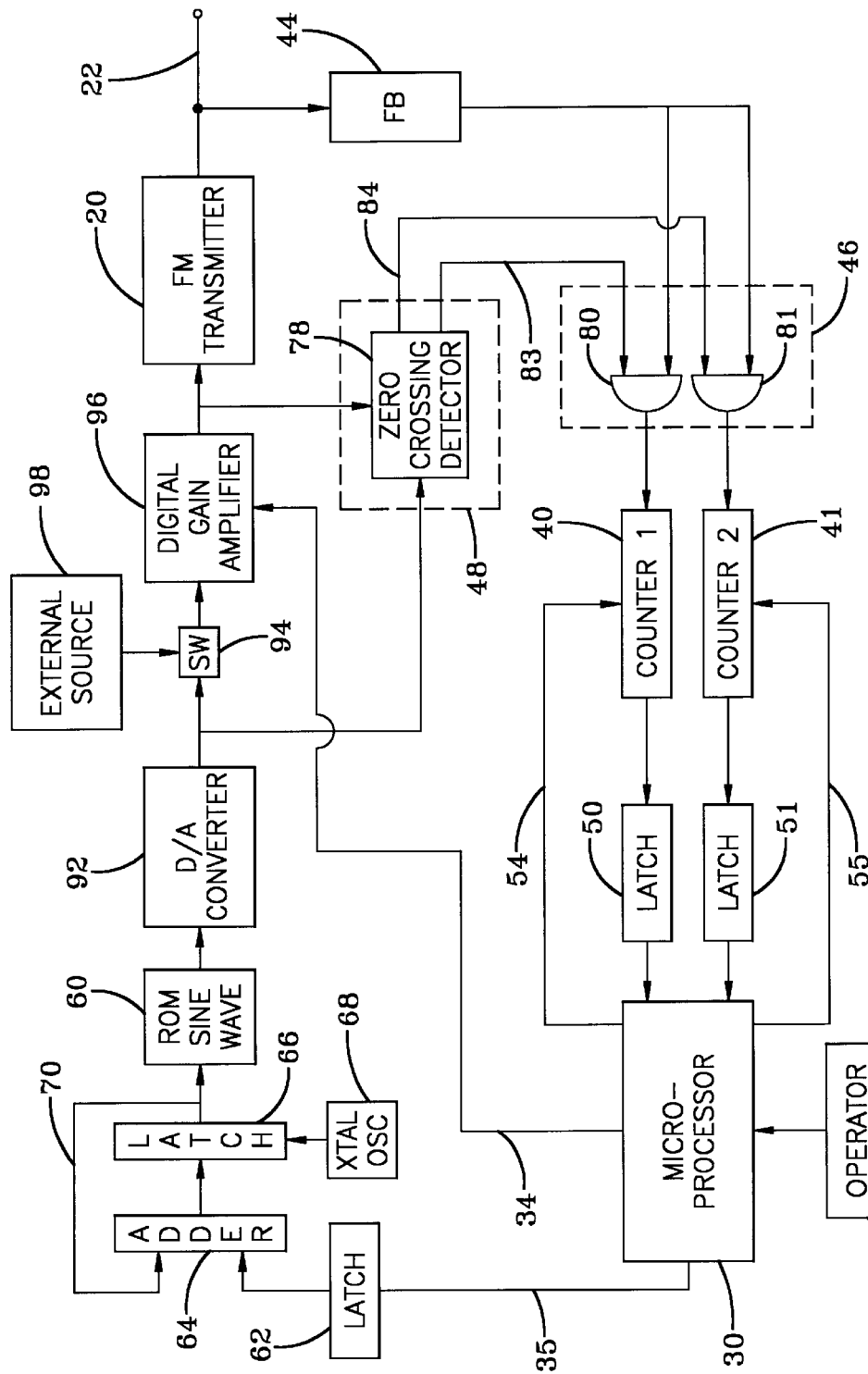
FIG. 7 illustrates another embodiment of the invention.

FIG. 7 illustrates an embodiment of the invention similar to that of FIG. 4, however, with the added ability to have an external signal as a modulating source. In the arrangement of FIG. 7 a calibrating sine wave is generated by the ROM 60 and converted to an analog signal by D/A converter 92 prior to any amplitude correction. This calibrating sine wave is passed through switch 94 to a multiplier which applies gain to obtain the desired frequency deviation, as previously described. In one embodiment, the multiplication may be performed by a digital gain amplifier 96 which receives a digital number representing gain, from microprocessor 30 and provides an analog output modulating signal to FM transmitter 20. Thus, a certain known reference voltage level of calibrating waveform into switch 94, from D/A converter 92, will produce a certain corresponding frequency deviation at the output 22.

Once the correct deviation is achieved, the digital gain amplifier 96 remains at its current correction level and the calibration function is discontinued. Thereafter, the switch 94 may be activated to receive a modulating signal such as voice, sonar or other acoustical data, calibrating tones, etc., from an external source 98. It is known then, that a voltage level from the external source 98 (which may be limited or scaled, if necessary) corresponding to the reference voltage level, will produce the exact same peak frequency deviation as the reference voltage level produced. The output wave may then be transmitted, in the case of voice, or may be used for data analysis, or testing and calibration of other equipment.

In instances where extreme temperature changes may vary performance, switch 94 may be periodically operated (for example, by microprocessor 30 or an operator) to accept the calibrating waveform from D/A converter 92, for recalibration, and then, the external waveform. Ideally, the initial calibration would be made at a nominal frequency commensurate with the frequency of the external source waveform, if known. If not, the frequency response can be assumed to be relatively flat over some range and although the calibration frequency is not exactly the same as the external source frequency, satisfactory operation can still be obtained.

After reading the foregoing specification, one of ordinary skill in the art will be able to effect various changes, substitutions of equivalents and various other aspects of the present invention as broadly disclosed herein. It is therefore intended that the protection granted hereon be limited only by the definition contained in the appended claims and equivalents. Having thus shown and described what is at present considered to be the preferred embodiment of the present invention, it should be noted that the same has been made by way of illustration and not limitation. Accordingly, all modifications, alterations and changes coming within the spirit and scope of the present invention are herein meant to be included.

What is claimed is:

1. Automatic frequency deviation correction apparatus for a frequency modulated system, comprising:

a source of RF carrier signal of center frequency $F_c$;

a source of modulating signal of frequency $F_m$, having positive and negative half cycles and coupled to modulate the frequency of said carrier signal about said center frequency, as a function of the amplitude of said modulating signal, to produce a frequency modulated output signal;

a gate circuit;

a feedback arrangement connecting said frequency modulated output signal to said gate circuit as a feedback signal;

first and second counters;

a gate select means for sensing said positive and negative half cycles of said modulating signal and operable to cause said gate circuit to provide said feedback signal to said first counter, which counts the number of cycles in said feedback signal during said positive half cycle of said modulating signal;

said gate select means being additionally operable to cause said gate circuit to provide said feedback signal to said second counter, which counts the number of cycles in said feedback signal during said negative half cycle of said modulating signal;

a microprocessor connected to said first and second counters and operable to obtain the count difference between said first and second counters, and from said count difference, determine the deviation of said frequency modulated output signal from said center frequency;

said microprocessor being further operable to calculate and generate a correction signal if the difference between a predetermined desired deviation and said deviation determined by said microprocessor is greater than a predetermined value;

said microprocessor applying said correction signal to vary the amplitude of said modulating signal until said difference does not exceed said predetermined value.

2. Apparatus according to claim 1 wherein:

said source of modulating signal is operable to selectively vary said frequency $F_m$.

3. Apparatus according to claim 2 wherein:

said microprocessor is operably connected to said source of modulating signal to command a modulating signal of a frequency selected by an operator.

4. Apparatus according to claim 1 wherein:

said source of modulating signal provides a sine wave signal.

5. Apparatus according to claim 1 wherein:

said source of modulating signal is a direct digital synthesizer.

6. Apparatus according to claim 1 wherein:

said first and second counters are resettable by respective reset signals provided by said microprocessor.

7. Apparatus according to claim 6 wherein:

said microprocessor resets said first and second counters after N cycles of said modulating signal.

8. Apparatus according to claim 1 which includes:

a first latch connected to receive the count generated by said first counter;

a second latch connected to receive the count generated by said second counter;

said first and second latches being connected as inputs to said microprocessor to transfer the counts in said counters to said microprocessor.

9. Apparatus according to claim 1 wherein:

said gate circuit is comprised of first and second AND gates, each receiving said feedback signal, and each receiving a respective gate enabling signal from said gate select means.

10. Apparatus according to claim 9 wherein:

said gate select means is a zero crossing detector having first and second outputs for providing, on said first output, a gate enabling signal to said first AND gate during said positive half cycle of said modulating signal, and for providing, on said second output, a gate enabling signal to said second AND gate during said negative half cycle of said modulating signal.

11. Apparatus according to claim 1 wherein:

said feedback arrangement includes a system for converting said frequency modulated output signal to a lower, intermediate frequency.

12. Apparatus according to claim 1 wherein:

said source of modulating signal provides a signal having a set reference voltage level;

said microprocessor is operable to apply said correction signal to said signal having a set reference voltage level until said count difference between said counters does not exceed said predetermined amount; and which additionally includes, an external source of modulating signal;

a switch for selectively applying either said external source of modulating signal or said signal having a set reference voltage level, suitably corrected, to said source of RF carrier signal.

13. Automatic frequency detection apparatus for a frequency modulated system, comprising:

a source of RF carrier signal of center frequency $F_c$;

a source of modulating signal of frequency $F_m$, having positive and negative half cycles and coupled to modulate the frequency of said carrier signal about said center frequency, as a function of the amplitude of said modulating signal, to produce a frequency modulated output signal;

a gate circuit;

a feedback arrangement connecting said frequency modulated output signal to said gate circuit as a feedback signal;

first and second counters;

a gate select means for sensing said positive and negative half cycles of said modulating signal and operable to cause said gate circuit to provide said feedback signal to said first counter, which counts the number of cycles in said feedback signal during said positive half cycle of said modulating signal;

said gate select means being additionally operable to cause said gate circuit to provide said feedback signal to said second counter, which counts the number of cycles in said feedback signal during said negative half cycle of said modulating signal;

a microprocessor connected to said first and second counters and operable to obtain the count difference between said first and second counters, and from said count difference, determine the deviation of said frequency modulated output signal from said center frequency.

* * * * *